TRANSISTOR AMPLIFIER WITH HIGH UNDISTORTED OUTPUT

Filed June 27, 1950

INVENTOR
RICHARD F. SCHWARTZ
BY H. O. Newton
ATTORNEY

Patented Oct. 5, 1954

2,691,075

UNITED STATES PATENT OFFICE 2,691,075

TRANSISTOR AMPLIFIER WITH HIGH UNDISTORTED OUTPUT

Richard F. Schwartz, Gibbsboro, N. J., assignor to Radio Corporation of America, a corporation of Delaware Application June 27, 1950, Serial No. 170,601

7 Claims. (Cl. 179—171)

This invention relates generally to low distortion amplifiers, and more particularly relates to both single-ended and push-pull amplifier systems of the semi-conductor type which have a higher undistorted output than previously known semi-conductor amplifiers.

Semi-conductor amplifiers or transistor amplifiers are well known in the art. It is also known that they have a certain amount of signal distortion which increases with the signal strength. The distortion is partly due to the non-linear voltage-current characteristic of the emitter of the amplifier. This may be explained as a small variation of the equivalent emitter resistance, that is, the resistance looking into the emitter electrode, which varies slightly as the input signal goes through one electrical cycle. Although the absolute variation of the emitter resistance is small, the percentage variation may become large resulting in a comparatively large distortion of the output signal.

It is also well known that a push-pull amplifier system has greater power output and less distortion than a single-ended amplifier. However, it is very difficult to manufacture transistors with matching electrical characteristics which may be used in a push-pull amplifier system. Accordingly, it would be desirable to provide some means for neutralizing the effect of the different dynamic input characteristics of two transistor units in a push-pull amplifier system.

It is accordingly an object of the present invention to provide improved single-ended or push-pull semi-conductor amplifier systems having substantially less signal distortion than previously known amplifiers of this type.

A further object of the invention is to provide simple circuit means in a single-ended or push-pull amplifier of the semi-conductor type whereby a higher undistorted output signal may be obtained than with known amplifiers of this type.

Another object of the invention is to provide an improved push-pull semi-conductor amplifier system which will permit the utilization of two semi-conductor amplifier units of different electrical characteristics.

In accordance with the present invention a resistive impedance element is effectively connected in the alternating-current input or output circuit of a semi-conductor amplifier system. The resistive impedance element has such a resistance as to reduce substantially signal distortion of the system. In other words, the signal distortion may be reduced with the same power output or a higher power output may be obtained without increasing the signal distortion. In accordance with one embodiment of the present invention a capacitor and a resistor are connected in series across a portion of a direct current path which supplies bias voltages to either the emitter or to the collector electrode of the amplifier system. The capacitor presents a low impedance to the input signal while the resistor has such a resistance as to reduce signal distortion. Alternatively, a resistor may be provided in the primary winding of an input transformer which has a secondary winding connected between base and emitter of the amplifier system.

In a push-pull amplifier system, in accordance with the present invention, a resistive impedance element is connected effectively in one of the common alternating-current input or output circuits of the system. Such a resistive impedance element will also balance the unequal electrical characteristics of the two transistors of the amplifier system. It is, of course, also feasible to provide a separate linearizing resistor in the alternating-current input or output circuits of each amplifier of the push-pull amplifier system.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3, 4, 5, 6:
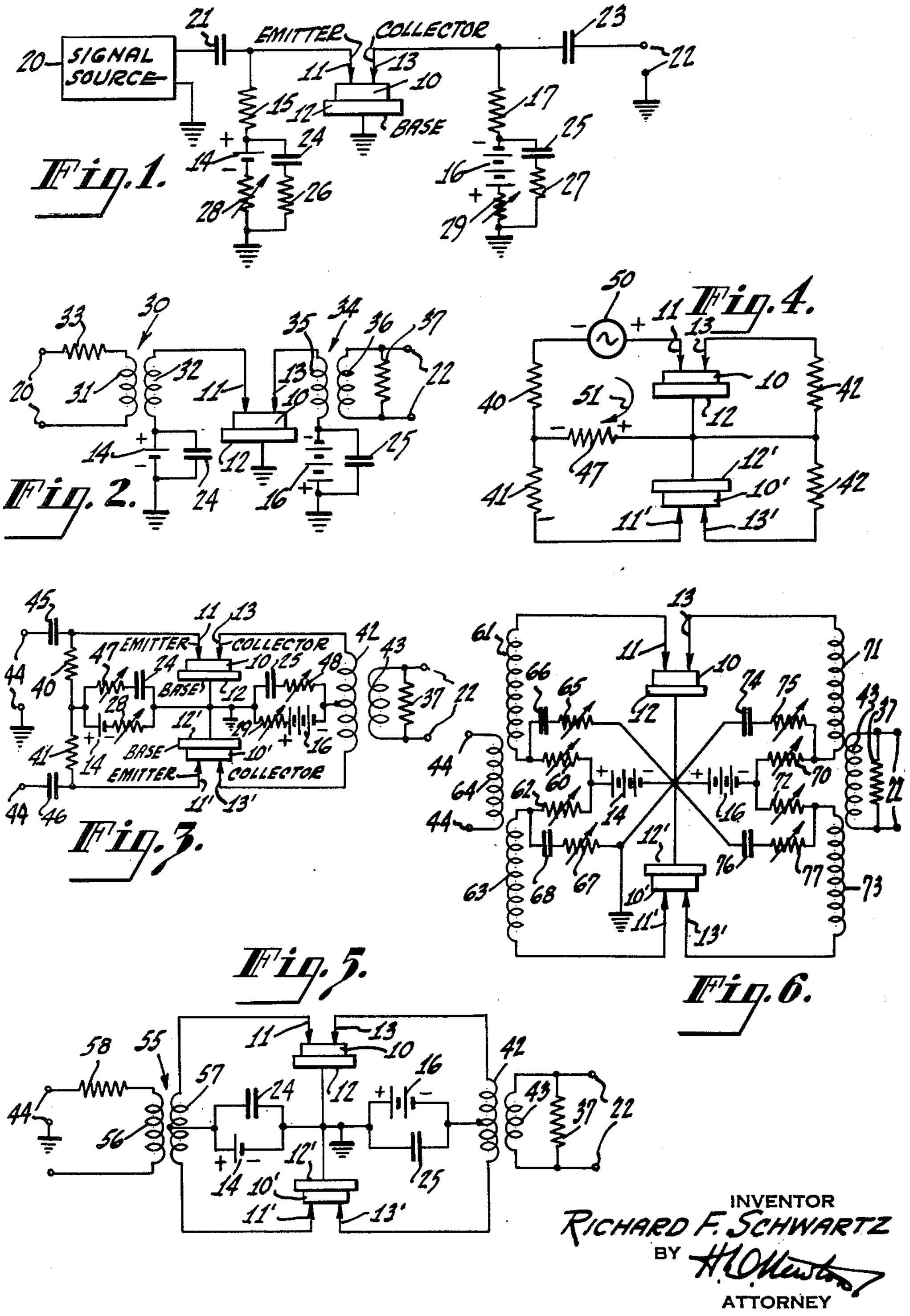
Figure 1 is a circuit diagram of a single-ended semi-conductor amplifier circuit embodying the present invention.
Figure 2 is a circuit diagram of a modified single-ended amplifier system in accordance with the invention.
Figure 3 is a circuit diagram of a push-pull amplifier circuit wherein means are provided in accordance with the invention for balancing the circuit for the dissimilar electrical characteristics of the two semi-conductor amplifiers of the circuit.
Figure 4 is an equivalent circuit diagram of the push-pull amplifier of Figure 3 which will be referred to in explaining the noise or distortion balancing action of the circuit of Figure 3.
Figure 5 is a circuit diagram of a push-pull amplifier system representing a further embodiment of the invention.
Figure 6 is a circuit diagram of a semi-conductor push-pull amplifier system, also in accordance with the invention, showing the use of separate means for reducing the distortion in each semi-conductor amplifier of the system.

Referring now to the drawing, in which like components have been designated by the same reference numerals throughout the figures and particularly to Figure 1, there is illustrated a single-ended amplifier system in accordance with the invention comprising a semi-conducting body 10. Body 10 may consist of a semi-conducting crystal such, for example as germanium or silicon containing a small number of impurity centers or lattice imperfections. The surface of body 10 may be polished and etched as is conventional in the art. Body 10 may consist of N type germanium although it is feasible to use P type germanium. For the following discussion it will be assumed that body 10 is of the N type.

Emitter electrode 11, base electrode 12 and collector electrode 13 are in contact with body 10. Base electrode 12 is in low-resistance contact with body 10 and may, for example, be a large-area electrode. Thus, the base electrode may be represented by a suitable piece of metal such as brass which has been soldered to body 10. Emitter electrode 11 and collector electrode 13 are in rectifying contact with body 10. They may be small-area electrodes such as point or line contact electrodes which may consist, for example, of tungsten or Phosphor bronze wires. If electrodes 11 and 13 are point electrodes, the wire ends may be pointed.

For the purpose of applying operating potentials to the semi-conductor device a bias voltage in the forward direction is applied between emitter 11 and base 12 while a bias voltage in the reverse direction is applied between collector 13 and base 12. Accordingly, emitter electrode 11 should be positive with respect to base 12 while collector electrode 13 should be negative with respect to base 12. If body 10 consists of a P type crystal, the potentials must be reversed. A suitable source of voltage such as battery 14 is provided for applying a bias voltage to emitter electrode 11. To this end the negative terminal of battery 14 is grounded while its positive terminal is connected to emitter electrode 11 through resistor 15. Battery 16 has its positive terminal grounded while its negative terminal is connected through resistor 17 to collector electrode 13. Base electrode 12 is grounded.

A signal to be amplified is developed by signal source 20 having one terminal grounded while its other terminal is coupled to emitter electrode 11 through coupling capacitor 21. The amplified output signal is developed across load resistor 17 and may be otbained from output terminals 22, one of which is grounded while the other one is coupled through coupling capacitor 23 to collector electrode 13.

The amplifier of Figure 1 as described herein is conventional. The input signal is impressed effectively between emitter electrode 11 and base electrode 12 while the amplified output signal is developed effectively between collector electrode 13 and base electrode 12. It is also conventional practice to bypass batteries 14 and 16 by capacitors 24 and 25, respectively, which have a low impedance for signal-frequency currents.

In accordance with the present invention a linearizing resistor 26 is provided in series with capacitor 24 both being connected across battery 14. Another linearizing resistor 27 may be provided in series with capacitor 25 and connected across battery 16. Linearizing resistors 26 and 27 are accordingly in the alternating-current input circuit and output circuit respectively. Batteries 14 and 16 should have an appreciable impedance for signal frequency currents so that the impedance of battery 14, for example, is larger for alternating currents than that of the shunt path 24, 26. To this end adjustable resistors 28 and 29 have been shown in series with batteries 14 and 16, respectively. The resistance of resistors 28 and 29 may be ten times that of resistors 26 and 27. It is to be understood that either resistor 26 or 27 may be omitted. Preferably, however, the amplifier system of the invention is provided with linearizing resistor 26 in the emitter circuit while resistor 27 in the collector circuit is optional. The magnitude of the resistance of resistors 26 and 27 determines the distortion of the output signal. Thus, the distortion may be substantially reduced by the provision of resistors 26 and 27 with the same output power. Alternatively, a higher output power may be obtained without increasing the signal distortion.

As explained previously, it is believed that the signal distortion is due to small variations of the resistance which appears looking into emitter electrode 11. This distortion is substantially reduced by the provision of resistor 26, for example, which is provided only in the alternating-current input circuit of the amplifier. The resistance of resistor 26 or of resistor 27 does not have an optimum value. The larger the resistance of resistor 26 or 27, the smaller the distortion but also the higher will be the power required to drive the amplifier. This will be understood more clearly from the following table showing typical results for an amplifier system in accordance with the invention having a transformer input circuit (see Figure 2) and where resistor 27 has been omitted.

| Resistance of Resistor 26 | Input Voltage | Output Voltage | Output Power | Percent Distortion |
|---|---|---|---|---|
| | *Volts* | *Volts* | *Mw.* | |
| 0 ohms | .15 | 1.0 | 3.2 | 15.8 |
| 210 ohms | .44 | 1.0 | 3.2 | 6.2 |
| 500 ohms | .79 | 1.0 | 3.2 | 3.7 |

It will accordingly be seen that the distortion is reduced to approximately one-quarter by the provision of resistor 26 having a resistance of 500 ohms. At the same time, however, the input voltage must be increased approximately five times to obtain the same power output. Thus, the higher the resistance of resistor 26, the less the distortion will be but a point is eventually reached where the distortion levels off. The distortion level is determined by the distortion of the input circuit and of signal source 20. Finally, the output power merely decreases as the resistance of resistor 26 is increased.

It has been found that the collector current is substantially linear with the emitter current but not with the emitter voltage. Thus, when the alternating emitter current which is the current supplied by signal source 20 is linearized, the collector current is linearized thereby to reduce the signal distortion.

It is also feasible to reflect the resistance provided in the primary of a transformer into the transformer secondary thereby to provide effectively a resistance in the alternating-current input circuit of the amplifier. Such an arrangement is illustrated in Figure 2. Input transformer 30 includes primary winding 31 and secondary winding 32. Resistor 33 is connected in series with input terminals 20 and primary winding 31. Secondary winding 32 is connected between battery 14 and emitter 11. Output transformer 34 includes primary winding 35 and secondary winding 36. Primary winding 35 is connected between collector 13 and battery 16. Secondary winding 36 is connected across output terminals 22. Output load resistor 37 is connected in shunt with secondary winding 36.

The circuit of Figure 2 operates substantially in the same manner as the circuit of Figure 1. The reflected resistance of resistor 33 appears in series with secondary winding 32. This resistance is, of course, not in the direct current path including battery 14, secondary winding 32 and emitter 11. The resistance of resistor 33 may be selected in the same manner as that of resistor 26 or 27 of the circuit of Figure 1 and a similar reduction of the distortion results.

A push-pull amplifier circuit in accordance with the invention is illustrated in Figure 3. The push-pull amplifier system includes two semi-conducting bodies 10 and 10′. A base electrode 12, 12′, an emitter electrode 11, 11′ and a collector electrode 13, 13′ are in contact with each body 10 and 10′ respectively. The two base electrodes 12 and 12′ are grounded as shown. Battery 14 and resistor 28 in series are connected between ground and the two emitter electrodes through resistors 40 and 41 respectively. Battery 16 and resistor 29 are serially connected between ground and the midpoint of primary winding 42 having a secondary or output winding 43. Load resistor 37 is connected in shunt with secondary winding 43, and the output signal may be derived from output terminals 22. A push-pull input signal is impressed on input terminals 44 which, as shown, are balanced with respect to ground. The push-pull input signal is impressed on emitter electrodes 11 and 11′ through capacitors 45 and 46.

Battery 14 and resistor 28 and battery 16 and resistor 29 are again bypassed for signal-frequency currents by capacitors 24 and 25, respectively. In accordance with the present invention resistors 47 and 48 are connected in series with capacitors 24 and 25 respectively across batteries 14 and 16.

Resistors 47 and 48 serve the same function as resistors 26 and 27 in Figure 1. Additionally, resistors 47 and 48 compensate for the inherent differences in the characteristics of the two amplifiers 10 and 10′. This will be explained more in detail by reference to Figure 4 which is an equivalent alternating-current circuit of the push-pull amplifier of Figure 3. As shown in Figure 4, resistor 47 is in the common alternating current emitter circuit of the two amplifiers 10 and 10′. Generator 50 represents the noise or distortion voltage produced by the circuit of emitter electrode 11. This voltage will cause a current to flow in the direction indicated by arrow 51 thereby producing a voltage drop across resistor 47.

Thus, if the terminal of generator 50 connected to emitter 11 is positive, a negative voltage will be developed at the junction point of resistors 40, 41 with resistor 47. This negative voltage will be impressed on emitter electrode 11′. Thus, a voltage in phase opposition is impressed on emitter electrode 11′ which counteracts the original distortion voltage developed by generator 50. Therefore, the distortion produced by each amplifier 10 or 10′ injects an opposing distortion voltage into the other amplifier. A definite optimum value for the resistance of resistor 47 or 48 exists. This is due to the fact that the resistance needed to cancel one harmonic term completely is not the same as the value needed to cancel another harmonic term completely. It has been found experimentally that the resistance of resistor 47 should be of the order of 100 to 200 ohms. The following table gives some information on the reduction of distortion due to the provision of resistor 47, resistor 48 being omitted. The tests were taken with a transformer input circuit as shown in Figure 5.

| Resistance of Resistor 47 | Input Voltage | Output Voltage | Output Power | Percent Distortion |
|---|---|---|---|---|
| | *Volts* | *Volts* | *Mw.* | |
| 0 ohms | 0.2 | 1.55 | 7.2 | 25 |
| 105 ohms | 0.39 | 1.55 | 7.2 | 1.97 |

It will therefore be seen that the distortion has been reduced more than 12 times while the driving voltage had to be increased by a factor of approximately 2. Thus, the improvement in distortion in the push-pull circuit does not require as much increase in the driving power as does the single-ended driving circuit.

Figure 5 illustrates a modified push-pull amplifier in accordance with the invention. The input circuit includes transformer 55 having a primary winding 56 and a secondary winding 57. Linearizing resistor 58 is connected in series with input terminals 44 and primary winding 56. The midpoint of secondary winding 57 is connected to battery 14 while its terminals are connected to emitter electrodes 11 and 11′. The two base electrodes 12 and 12′ are grounded as shown. The output circuit is similar to that shown in Figure 3.

In the push-pull amplifier system of Figure 5 the resistance of resistor 58 is reflected into the alternating-current input circuit. In other words, the reflected resistance appears in series with the secondary winding 57 in the alternating-current circuits of both emitter electrodes 11 and 11′. The effect of resistor 58 is similar to that of resistor 33 in the single-ended amplifier circuit of Figure 2.

The push-pull amplifier circuit of Figure 6 permits an individual adjustment of the direct-current bias voltages applied to both amplifiers 10 and 10′ and also an individual adjustment of the resistance in the alternating current input and output circuits of each amplifier. Thus, battery 14 is connected through resistor 60 and winding 61 to emitter electrode 11. Battery 14 is also connected through resistor 62 and winding 63 to emitter electrode 11′. The input signal is impressed through terminals 44 on primary winding 64 which is inductively coupled to windings 61 and 63 which represent the secondary windings of the input transformer. Battery 14 and resistor 60 are shunted by resistor 65 and capacitor 66 connected in series. Capacitor 66 bypasses signal-frequency currents while resistor 65 functions as the linearizing resistor. Similarly, battery 14 and resistor 62 are shunted by resistor 67 and capacitor 68 connected in series. Capacitor 68 bypasses signal-frequency currents and resistor 67 again functions as the linearizing resistor for amplifier 10′. Resistors 60, 62, 65 and 67 may be adjustable as shown to adjust the emitter bias voltages and the resistance of the linearizing resistors.

Collector battery 16 is connected through resistor 70 and winding 71 to collector electrode 13. Similarly, battery 16 is connected through resistor 72 and winding 73 to collector electrode 13'. Capacitor 74 and resistor 75 connected in series are shunted across battery 16 and resistor 70. Furthermore, capacitor 76 and resistor 77 are shunted across battery 16 and resistor 72. Resistors 70 and 72 may be adjustable to adjust the collector bias voltages. Linearizing resistors 75 and 77 may also be adjustable as shown. Windings 71 and 73 are inductively coupled to output winding 43 across which load resistor 37 is shunted. The output signal may be obtained from output terminals 22.

It is to be understood that linearizing resistors 65, 67, 75 and 77 are of the order of 200 to 500 ohms while resistors 60, 62 and 70, 72 are of the order of 2,000 ohms or more. In view of the previous explanations the operation of the push-pull amplifier system of Figure 6 will be evident. It is to be understood that linearizing resistors 75 and 77 may be omitted if desired.

The push-pull amplifier system of Figure 6 may also be modified to provide a single linearizing resistor for both emitter circuits and another single linearizing resistor for both collector circuits. To this end capacitor 66 should be connected to the junction point of battery 14 with resistors 60, 62. Battery 14 should have a high alternating current impedance which may be obtained, for example, by connecting a choke coil in series with the battery. Capacitor 66 and resistor 65 will then shunt the high impedance voltage source 14. Similarly, capacitor 74 and resistor 75 may be connected in shunt with battery 16 which should have a high alternating current impedance which may be obtained by connecting a choke coil in series with battery 16.

There have thus been disclosed single-ended and push-pull semi-conductor amplifier systems having a high undistorted output. The signal distortion is considerably reduced with the same output power or the output power may be increased without increasing the distortion as compared to previously known semi-conductor amplifiers. Push-pull amplifier circuits have been disclosed which permit the utilization of two semi-conductor amplifier units with dissimilar electrical characteristics. In that case, the reduction of the signal distortion is appreciable while the required input power is only slightly increased.

What is claimed is:

1. An amplifier system comprising a semi-conducting body, a base electrode, an emitter electrode and a collector electrode in contact with said body, a first source of voltage connected between said emitter and base electrodes in such a polarity as to impress a voltage on said electrodes in the forward direction, a signal frequency by-pass capacitor and a resistor connected in series across said first source, a second source of voltage connected between said collector and base electrodes in such a polarity as to impress a voltage on said electrodes in the reverse direction, an input circuit coupled between said emitter and base electrodes, and an output circuit coupled between said collector and base electrodes, said resistor having such a resistance as to reduce substantially signal distortion of said amplifier system.

2. An amplifier system comprising a semi-conducting body, a base electrode, an emitter electrode and a collector electrode in contact with said body, a first source of voltage connected between said emitter and base electrodes in such a polarity as to impress a voltage on said electrodes in the forward direction, a second source of voltage connected between said collector and base electrodes in such a polarity as to impress a voltage on said electrodes in the reverse direction, a signal frequency by-pass capacitor and a resistor connected in series across said second source, an input circuit coupled between said emitter and base electrodes, and an output circuit coupled between said collector and base electrodes, said resistor having such a resistance as to reduce substantially signal distortion of said amplifier system.

3. An amplifier system comprising a semi-conducting body, a base electrode, an emitter electrode and a collector electrode in contact with said body, a first source of voltage connected between said emitter and base electrodes in such a polarity as to impress a voltage on said electrodes in the forward direction, a first signal-frequency by-pass capacitor and a first resistor connected in series across said first source, a second source of voltage connected between said collector and base electrodes in such a polarity as to impress a voltage on said electrodes in the reverse direction, a second signal-frequency by-pass capacitor and a second resistor connected in series across said second source, an input circuit coupled between said emitter and base electrodes, and an output circuit coupled between said collector and base electrodes, said resistors having such a resistance as to reduce substantially signal distortion of said amplifier system.

4. A push-pull amplifier system comprising a pair of semi-conducting bodies, a base electrode, an emitter electrode and a collector electrode in contact with each body, a conductive connection between said base electrodes, a first direct current path between said base electrodes, and each of said emitter electrodes, said first path including a first portion common to both emitter electrodes, means connected in said first portion for applying a bias voltage in the forward direction between each of said emitter electrodes and said base electrodes, a second direct current path connected between said base electrodes and each of said collector electrodes, said second path including a second portion common to both collector electrodes, means connected in said second portion for applying a bias voltage in the reverse direction between each of said collector electrodes and said base electrodes, a signal-frequency by-pass capacitor and a resistor connected in series across one of said portions, said resistors having such a resistance as to reduce substantially the signal distortion of said amplifier system and to balance the unequal electrical characteristics of said two bodies, a signal input circuit coupled between said emitter electrodes, and a signal output circuit coupled between said collector electrodes.

5. A push-pull amplifier system comprising a pair of semi-conducting bodies, a base electrode, an emitter electrode and a collector electrode in contact with each body, a conductive connection between said base electrodes, a direct current path connected between said base electrodes and each of said emitter electrodes, said path including a portion common to both emitter electrodes, means connected in said portion for applying a bias voltage in the forward direction between each of said emitter electrodes and said base electrodes, means for applying a bias voltage in the reverse direction between each of said collector electrodes and said base electrodes, a signal-frequency by-pass capacitor and a resistor connected in series across said portion, said resistor having such a resistance as to reduce substantially the signal distortion of said amplifier system and to balance the unequal electrical characteristics of said two bodies, a signal input circuit coupled between said emitter electrodes, and a signal output circuit coupled between said collector electrodes.

6. A push-pull amplifier system comprising a pair of semi-conducting bodies, a base electrode, an emitter electrode and a collector electrode in contact with each body, a conductive connection between said base electrodes, means for applying a bias voltage in the forward direction between each of said emitter electrodes and said base electrodes, a direct current path connected between said base electrodes and each of said collector electrodes, said path including a portion common to both collector electrodes, means connected in said portion for applying a bias voltage in the reverse direction between each of said collector electrodes and said base electrodes, a signal frequency by-pass capacitor and a resistor connected in series across said portion, having such a resistance as to reduce substantially the signal distortion of said amplifier system and to balance the unequal electrical characteristics of said two bodies, a signal input circuit coupled between said emitter electrodes, and a signal output circuit coupled between said collector electrodes.

7. A push-pull amplifier system comprising a pair of semi-conducting bodies, a base electrode, an emitter electrode and a collector electrode in contact with each body, a conductive connection between said base electrodes, a first direct current path connected between said base electrodes and each of said emitter electrodes, said first path including a first portion common to both emitter electrodes, means connected in said first portion for applying a bias voltage in the forward direction between each of said emitter electrodes and said base electrodes, a second direct current path connected between said base electrodes and each of said collector electrodes, said second path including a second portion common to both collector electrodes, means connected in said second portion for applying a bias voltage in the reverse direction between each of said collector electrodes and said base electrodes, a first signal-frequency by-pass capacitor and a first resistor connected in series across said first portion, a second signal-frequency by-pass capacitor and a second resistor connected in series across said second portion, said resistors having such a resistance as to reduce substantially the signal distortion of said amplifier system and to balance the unequal electrical characteristics of said two bodies, a signal input circuit coupled between said emitter electrodes, and a signal output circuit coupled between said collector electrodes.

References Cited in the file of this patent

UNITED STATES PATENTS

| Number | Name | Date |
|---|---|---|
| 2,273,432 | Brewer | Feb. 17, 1942 |
| 2,541,322 | Barney | Feb. 13, 1951 |
| 2,609,459 | Bergson | Sept. 2, 1952 |
| 2,647,957 | Mallinckrodt | Aug. 4, 1953 |
| 2,647,958 | Barney | Aug. 4, 1953 |